(12) United States Patent
Utomo et al.

(10) Patent No.: US 8,492,286 B2
(45) Date of Patent: Jul. 23, 2013

(54) METHOD OF FORMING E-FUSE IN REPLACEMENT METAL GATE MANUFACTURING PROCESS

(75) Inventors: Henry K. Utomo, Newburgh, NY (US); Ying Li, Newburgh, NY (US); Gerald L. Leake, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 387 days.

(21) Appl. No.: 12/951,107

(22) Filed: Nov. 22, 2010

(65) Prior Publication Data

US 2012/0129312 A1    May 24, 2012

(51) Int. Cl.
*H01L 21/302* (2006.01)
*H01L 21/461* (2006.01)

(52) U.S. Cl.
USPC ........... 438/712; 438/381; 438/721; 438/755; 257/377; 257/413

(58) Field of Classification Search
USPC .................. 438/381, 712, 721, 755; 257/377, 257/413
See application file for complete search history.

(56) References Cited

U.S. PATENT DOCUMENTS

| | | | |
|---|---|---|---|
| 5,933,748 A * | 8/1999 | Chou et al. | 438/431 |
| 6,004,864 A | 12/1999 | Huang et al. | |
| 6,054,354 A | 4/2000 | Nowak et al. | |
| 6,525,380 B2 | 2/2003 | Shirahata et al. | |
| 7,382,036 B2 | 6/2008 | Nowak et al. | |
| 7,514,376 B2 | 4/2009 | Hori | |
| 7,817,455 B2 * | 10/2010 | Fredeman et al. | 365/96 |
| 8,053,809 B2 * | 11/2011 | Cheng et al. | 257/173 |
| 8,058,125 B1 * | 11/2011 | Lin et al. | 438/238 |
| 8,138,037 B2 * | 3/2012 | Chudzik et al. | 438/199 |
| 8,361,848 B2 * | 1/2013 | Lee et al. | 438/171 |
| 2001/0002322 A1 * | 5/2001 | Marr et al. | 438/132 |
| 2006/0071285 A1 | 4/2006 | Datta et al. | |
| 2009/0179302 A1 * | 7/2009 | Kothandaraman et al. | 257/529 |
| 2010/0019344 A1 | 1/2010 | Chuang et al. | |
| 2010/0059823 A1 | 3/2010 | Chung et al. | |
| 2010/0193867 A1 | 8/2010 | Yan et al. | |
| 2010/0237435 A1 * | 9/2010 | Chudzik et al. | 257/380 |
| 2011/0156857 A1 * | 6/2011 | Kurz et al. | 337/414 |
| 2011/0266637 A1 * | 11/2011 | Lee et al. | 257/410 |

FOREIGN PATENT DOCUMENTS

| | | |
|---|---|---|
| EP | 1139422 | 4/2001 |
| KR | 1020090076488 | 7/2009 |
| KR | 1020070076046 | 7/2012 |

* cited by examiner

*Primary Examiner* — Jarrett Stark
*Assistant Examiner* — Nicholas Tobergte
(74) *Attorney, Agent, or Firm* — Yuanmin Cai

(57) ABSTRACT

Embodiment of the present invention provides a method of forming electronic fuse or commonly known as e-fuse. The method includes forming a polysilicon structure and a field-effect-transistor (FET) structure together on top of a common semiconductor substrate, the FET structure having a sacrificial gate electrode; implanting at least one dopant into the polysilicon structure to create a doped polysilicon layer in at least a top portion of the polysilicon structure; subjecting the polysilicon structure and the FET structure to a reactive-ion-etching (RIE) process, the RIE process selectively removing the sacrificial gate electrode of the FET structure while the doped polysilicon layer being substantially unaffected by the RIE process; and converting the polysilicon structure including the doped polysilicon layer into a silicide to form the electronic fuse.

16 Claims, 10 Drawing Sheets

US 8,492,286 B2

METHOD OF FORMING E-FUSE IN REPLACEMENT METAL GATE MANUFACTURING PROCESS

FIELD OF THE INVENTION

The present invention relates generally to the manufacturing of semiconductor devices, and in particular, to the formation of electronic fuse in a replacement metal gate manufacturing process.

BACKGROUND OF THE INVENTION

In the field of integrated circuit (IC) chip manufacturing, various active and passive devices may be manufactured on a common semiconductor substrate and subsequently interconnected through back-end-of-line technology to collectively provide a variety of functionalities for the IC chip. Active semiconductor devices may include, for example, transistors such as field-effect-transistors (FETs). A FET may be, among others, a complementary metal-oxide-semiconductor (CMOS) FET which may include a p-type FET (pFET) and an n-type FET (nFET). Passive devices may include, for example, resistors and electronic fuses, the latter of which may be commonly known as e-fuse. Generally, an integrated circuit chip may include devices that are redundant to other devices, mostly active, in order to provide fault protection in situations where one or more of the active devices fail during regular operation. In the event that an active device fails, a redundant "back-up" device, through electronically programming a designated e-fuse, sometimes automatically, may be used to re-configure the IC chip such that continuity of functionality of the IC chip may be properly maintained.

Most recently, advanced transistors made with a replacement metal gate (RMG) process were introduced because of their superior performance, in some aspect, with respect to the conventional poly gate transistors. During the manufacturing of replacement metal gate transistors, all of sacrificial gate electrode may be etched away and be replaced with metal gate as is known in the art. However, this particular process may be incompatible with the manufacturing process of certain passive devices that were conventionally manufactured with poly gate transistors. For example, the manufacturing process for electronic fuse, which utilizes silicided poly structures, may require modification in order to be properly integrated into the new replacement metal gate (RMG) process. Specifically, the silicide poly structure, which is necessary in the formation of an e-fuse, needs to be properly protected during the etching process of sacrificial gate electrode of transistors that may be neighboring the e-fuse. As a result, additional protective masks, and lithographic patterning and etching processes associated with the making of such masks, may be required, which results in increased complexity and overall cost of the device manufacturing.

Therefore, there exists in the art a need to develop new method or process and device structures that are compatible with such new method or process, to better integrate the process of manufacturing e-fuse into the process of manufacturing transistors with replacement metal gate.

SUMMARY OF THE INVENTION

Embodiment of the present invention provides a method of forming an electronic fuse (e-fuse) in a replacement metal gate process. The method includes forming a polysilicon structure and a field-effect-transistor (FET) structure together on top of a common semiconductor substrate, the FET structure having a sacrificial gate electrode; implanting at least one dopant into the polysilicon structure to create a doped polysilicon layer in at least a top portion of the polysilicon structure; subjecting the polysilicon structure and the FET structure to a reactive-ion-etching (RIE) process, the RIE process selectively removing the sacrificial gate electrode of the FET structure while the doped polysilicon layer being substantially unaffected by the RIE process; and converting the polysilicon structure including the doped polysilicon layer into a silicide to form the electronic fuse.

In one embodiment, the at least one dopant is boron (B), the boron being implanted into the polysilicon structure while the FET structure is protected from the boron implantation, by a photo-resist mask.

According to one embodiment, the method may further include, after the boron implantation, performing a rapid thermal annealing (RTA) process to activate the boron dopant such that the doped polysilicon layer being resistant to the RIE process.

According to another embodiment, the method may additionally include, before performing the RIE process, removing a cap layer on top of the sacrificial gate electrode of the FET structure, wherein the removing also removes, at most, a fraction of the doped polysilicon layer with rest of the doped polysilicon layer covering rest of the polysilicon structure.

In one embodiment, converting the polysilicon structure into the silicide further includes forming a hard mask pattern, the hard mask pattern covering the FET structure but exposing the doped polysilicon layer and the polysilicon structure underneath; depositing a metal layer in direct contact with the doped polysilicon layer; and causing diffusion, through a rapid thermal annealing process, of the metal layer into at least the doped polysilicon layer to create the silicide.

According to one embodiment, the metal layer is a layer of nickel, further comprising causing the nickel diffuse into the polysilicon structure underneath the doped polysilicon layer.

BRIEF DESCRIPTION OF THE DRAWINGS

The present invention will be understood and appreciated more fully from the following detailed description of the invention, taken in conjunction with the accompanying drawings of which.

Figure 1:
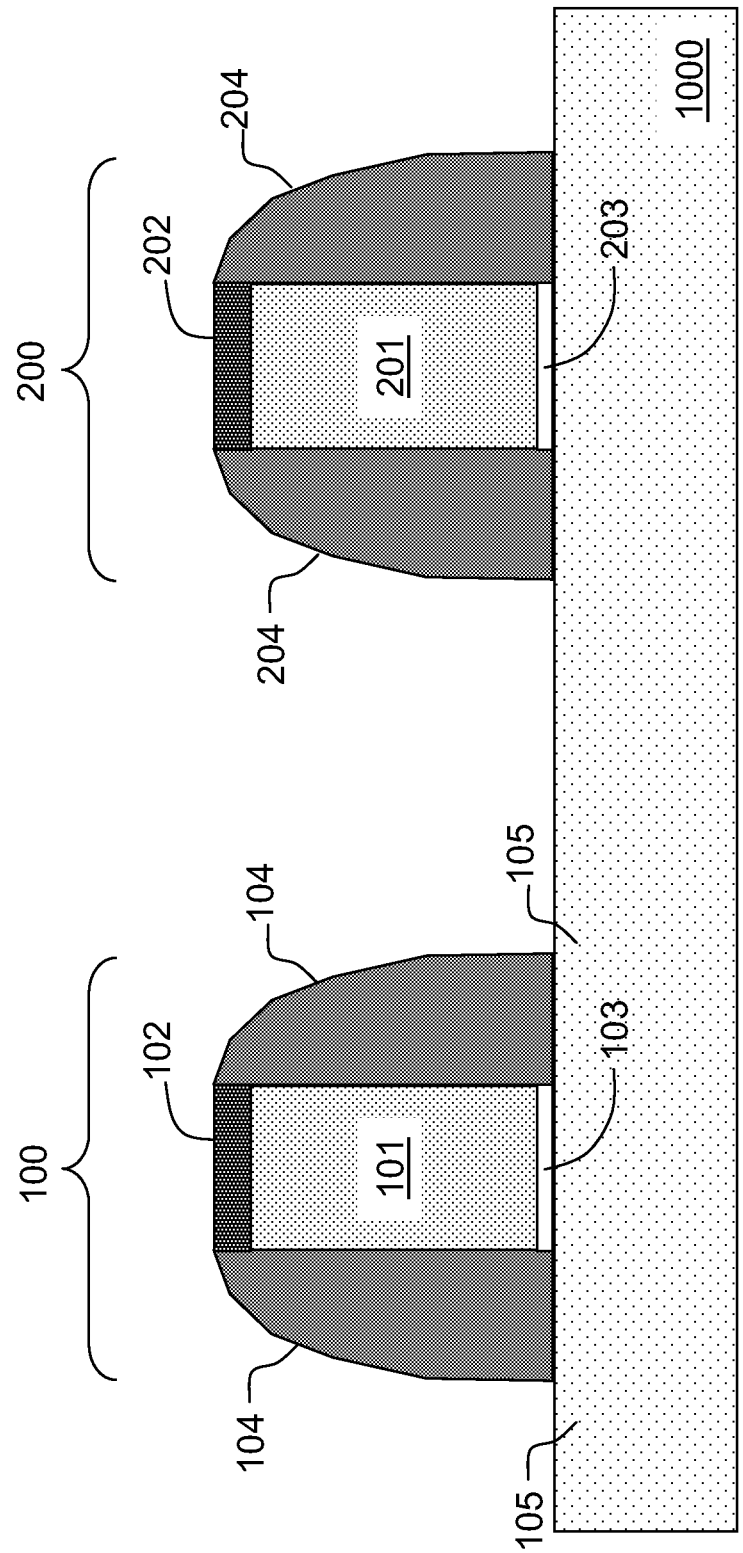
FIG. 1 is a demonstrative illustration of a method of forming e-fuse and transistor on a common substrate according to one embodiment of the present invention.

It will be appreciated by a person skilled in the art that for simplicity reason and for clarity of illustration, elements shown in the drawings have not necessarily been drawn to scale. For example, dimensions of some of the elements may be exaggerated relative to other elements for clarity purpose.

DETAILED DESCRIPTION OF THE INVENTION

In the following detailed description, numerous specific details are set forth in order to provide a thorough understanding of embodiments of the invention. However, it will be understood by those of ordinary skill in the art that embodiments of the invention may be practiced without these specific details. In other instances, well-known methods and procedures have not been described in detail so as not to obscure embodiments of the invention.

In the following description, various figures, diagrams, flowcharts, models, and descriptions are presented as different means to effectively convey the substances and illustrate different embodiments of the invention that are proposed in this application. It shall be understood by those skilled in the art that they are provided merely as exemplary samples, and shall not be constructed as limitation to the invention.

FIGS. 1-10 are demonstrative illustrations of a method of forming e-fuse in a replacement metal gate process in accordance with various embodiments of the present invention. More specifically, the method may be advantageously applied in forming e-fuses and transistors together on a common substrate in a combined process thereby simplifying the overall manufacturing procedure, although embodiments of the present invention are not limited in this aspect and the method may be applied to form e-fuses and transistors separately. In the below detailed description, steps of the method may be illustratively shown by a series of cross-sectional views of the semiconductor devices under manufacturing. Some well known steps and/or processes may be omitted in order not to obscure description of essence of the present invention.

Figure 10:
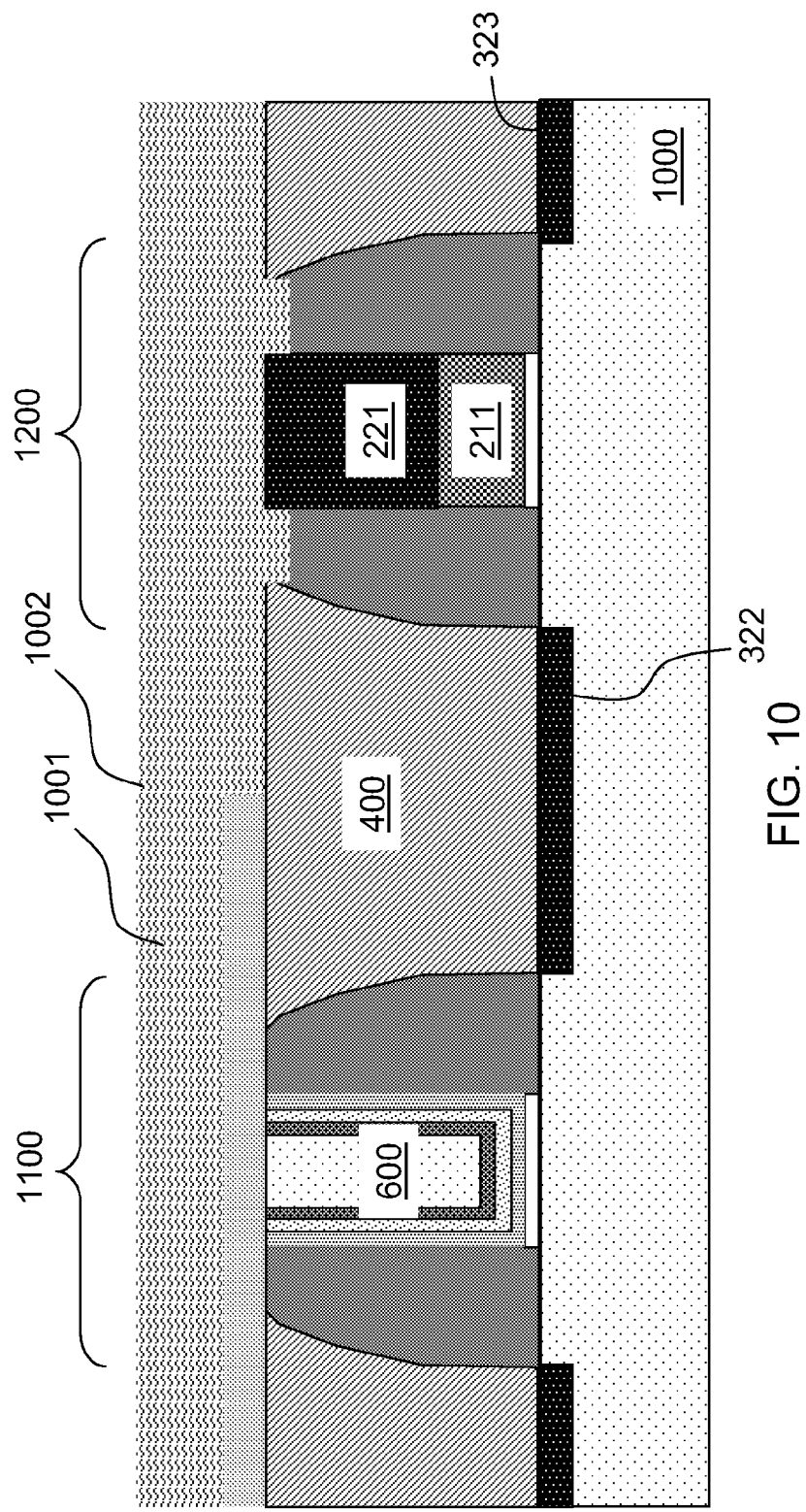
FIG. 10 is a demonstrative illustration of a method of forming e-fuse and transistor on a common substrate, following the steps shown in FIG. 9, according to one embodiment of the present invention.

According to one embodiment, the method may include initially forming at least two structures 100 and 200 on top of a semiconductor substrate 1000 as being illustrated in FIG. 1. For example, structure 100 may be a field-effect-transistor (FET) structure and structure 200 may be an electronic fuse (e-fuse) structure. Substrate 1000 may be any suitable semiconductor substrate such as, for example, a silicon (Si) substrate or a silicon-on-insulator (SOI) substrate. Structures 100 and 200 may be formed next to each other, or in close proximity, and therefore are assumed to subject to a common manufacturing process during which structure 100 may be formed into a transistor 1100 having a replacement metal gate while structure 200 may be formed into a poly e-fuse 1200 (FIG. 10). In one embodiment, both structures may be initially formed to have similar structural characteristics of a typical field-effect-transistor (FET) for the purpose of process simplicity and integration although such structural characteristics may not be necessary for structure 200, which is to be formed into an e-fuse.

Reference is now made to FIG. 1, wherein structure 100 may be formed to include a gate electrode 101 formed on top of substrate 1000 via a gate dielectric 103. In a replacement metal gate process, as being discussed hereinafter, gate electrode 101 may be made of a sacrificial polysilicon material. Embodiment of the present invention may further include forming a nitride layer 102 on top of, and thereby protecting, gate electrode 101 during a subsequent source/drain silicidation process. Moreover, spacers 104, such as nitride spacers, may be formed adjacent to sidewalls of gate electrode 101. At close proximity to spacers 104 in substrate 1000, source/drain 105 may be formed through ion-implantation.

Similarly, structure 200 may be formed to include a layer of polysilicon 201 on top of substrate 1000. Polysilicon layer 201 may be formed on top of a dielectric layer 203 and may be covered by a nitride cap layer 202 on top thereof. Structure 200 may also include spacers 204 that are formed adjacent to sidewalls of polysilicon layer 201. It is to be noted that because structure 200 is to be formed into an electronic fuse (e-fuse) according to the present invention, some of the above characteristics of structure 200, which are primarily designed for a transistor, may not be necessary for an electronic fuse but nevertheless are formed during the process of forming structure 100 in order to simplify the overall procedure of manufacturing. For example, doing so may avoid some additional steps that may be, otherwise, required in order to make structure 200 unnecessarily different from structure 100. Nevertheless, dielectric layer 203 underneath polysilicon layer 201 shall be formed to have a sufficient thickness in order to provide adequate insulation for polysilicon layer 201 from underneath substrate 1000 which may be silicon or silicon-on-insulator and is conductive.

Figure 2:
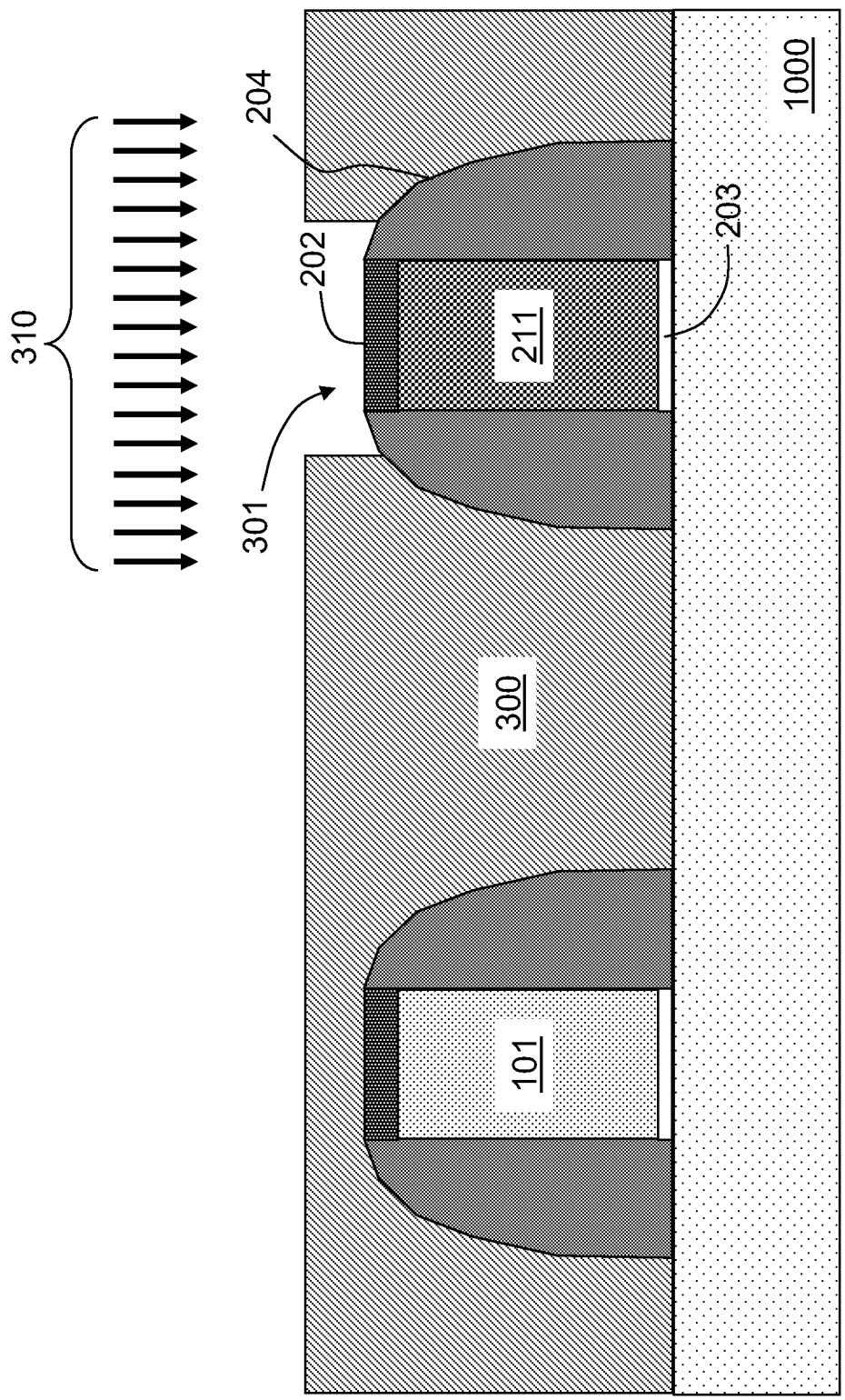
FIG. 2 is a demonstrative illustration of a method of forming e-fuse and transistor on a common substrate, following the steps shown in FIG. 1, according to one embodiment of the present invention.

FIG. 2 is a demonstrative illustration of a method of forming e-fuse in a replacement metal gate process, following the steps shown in FIG. 1, according to one embodiment of the present invention. More specifically, the method may include depositing a photo-resist layer 300 on top of and covering structures 100 and 200, and subsequently forming a pattern, through a standard photolithographic exposure process, to create an opening 301 in photo-resist layer 300. Opening 300 may expose polysilicon layer 201, and nitride cap layer 202 on top thereof, of structure 200 as illustrated in FIG. 2. Following the patterning of photo-resist layer 301, suitable dopants such as, for example, boron (B) may be implanted into polysilicon layer 201 through an ion-implantation process 310. During the ion implantation process, photo-resist layer 301 may be used as a mask to cover and protect FET structure 100, as well as other areas, where dopant implantation is not desirable.

Figure 4:
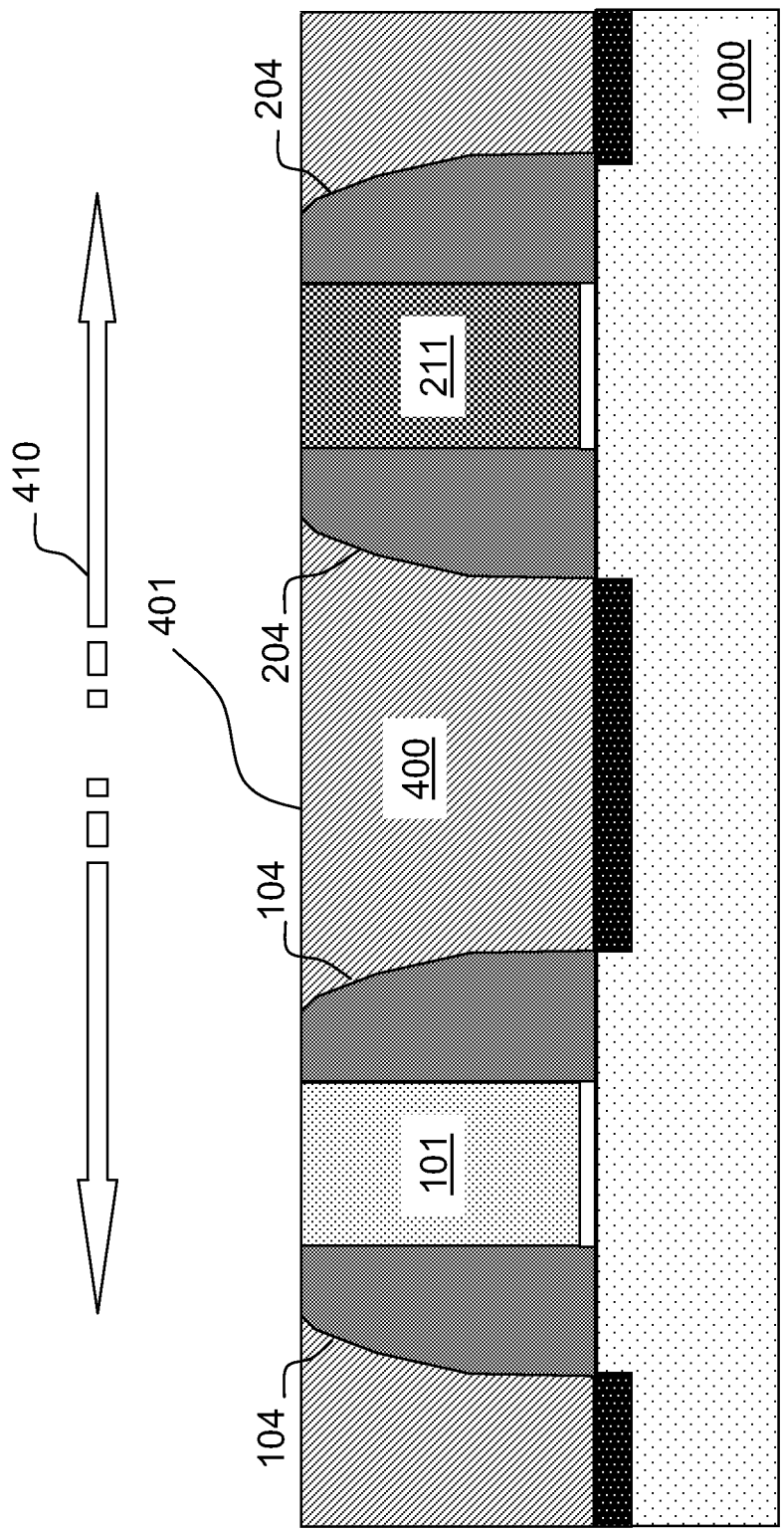
FIG. 4 is a demonstrative illustration of a method of forming e-fuse and transistor on a common substrate, following the steps shown in FIG. 3, according to one embodiment of the present invention.

According to one embodiment of the present invention, implantation of certain types of dopant in polysilicon layer 201 may create, inside structure 200, a modified polysilicon layer 211. Hereinafter, modified polysilicon layer 211 may also be referred to from time to time as a doped polysilicon layer. Embodiment of the present invention may include making modified polysilicon layer 211 such that the modified polysilicon layer 211 becomes selective to an etching process that will be used in subsequent steps to remove sacrificial gate electrode 101. The types of dopant used in the implantation process may include, for example, boron (B) or any other suitable dopants that will enhance the etch-selectivity of polysilicon layer 201. Conditions of the dopant implantation process may be properly adjusted such that at least a top portion of polysilicon layer 201 is implanted with the dopant or dopants to form modified or doped polysilicon layer 211 while a bottom portion of layer 201 may still remain as un-doped polysilicon. In other words, modified or doped polysilicon layer 211 may occupy only a top portion of polysilicon layer 201, and in such situation, the thickness of modified or doped polysilicon layer 211 shall be made at least larger than a thickness that may be removed during a poly-opening step in the replacement metal gate process as shown in FIG. 4. In one embodiment, the entire polysilicon layer 201 may be implanted with dopant or dopants and become fully modified or doped polysilicon layer 211 as shown in FIG. 2.

Figure 3:
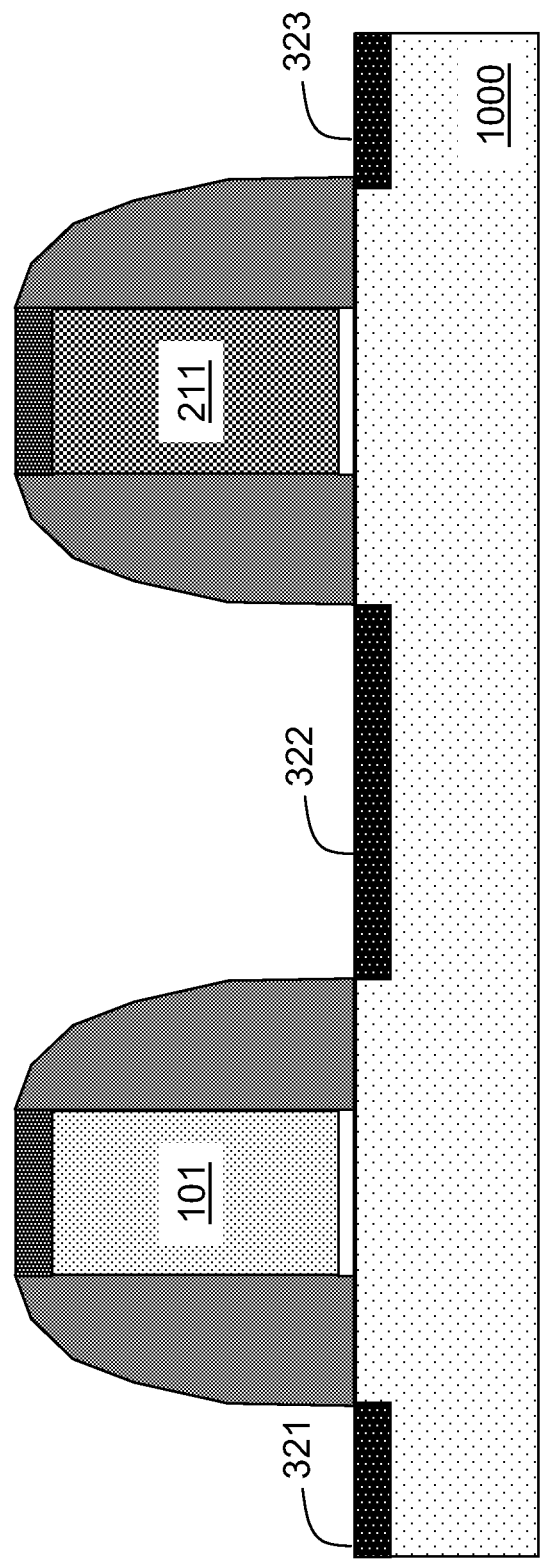
FIG. 3 is a demonstrative illustration of a method of forming e-fuse and transistor on a common substrate, following the steps shown in FIG. 2, according to one embodiment of the present invention.

FIG. 3 is a demonstrative illustration of a method of forming e-fuse in a replacement metal gate process, following the steps shown in FIG. 2, according to one embodiment of the present invention. After dopant implantation, one embodiment of the method may include stripping off remaining protective photo-resist layer 300 from top of structures 100 and 200 and the rest of substrate 1000, and performing a rapid thermal annealing (RTA) process to activate dopants being implanted in the modified polysilicon layer 211. According to embodiment of the present invention, the annealing process improves the effectiveness of etch-selectivity of modified polysilicon layer 211 to a poly-etching process. After activating the dopants, source and drain regions 105 of structure 100 may be subjected to a silicidation process to form silicide 321 and 322, which improves conductivity of transistor 1100 (FIG. 10) formed eventually from structure 100. As being discussed above, silicide 322 and 323 at the "source" and "drain" regions of structure 200 may not be necessary for e-fuse 1200 (FIG. 10) but they are preferably formed in order to simplify the overall manufacturing process.

FIG. 4 is a demonstrative illustration of a method of forming e-fuse in a replacement metal gate process, following the steps shown in FIG. 3, according to one embodiment of the present invention. After forming silicides in source and drain regions 105 of structure 100, according to one embodiment, the method includes depositing a dielectric layer 400 such as, for example, an oxide layer which blanket covers structures 100 and 200 and substrate 1000. The deposition of dielectric layer 400 may be followed by a chemical-mechanic-polishing (CMP) process 410 to planarize and thin-down dielectric layer 400 until polysilicon layer 101 of structure 100 is exposed. More specifically, CMP process 410 may remove nitride cap layers 102 and 202 and produce a flat top surface 401 of dielectric layer 400 that exposes polysilicon layer 101 of structure 100 and modified (or doped) polysilicon layer 211 of structure 200. CMP process 410 may also remove a top portion of spacers 104 and 204 of structures 100 and 200, respectively.

As being discussed above, the doped polysilicon layer 211 is formed at least at the upper portion of polysilicon layer 201 and has enough thickness to ensure that CMP process 410 stops before any underneath un-doped polysilicon layer 201 is exposed, should polysilicon layer 201 was not entirely converted into modified polysilicon layer 211 in the previous ion-implantation process 310. The covering of un-doped polysilicon layer 201, if any still existing, by modified polysilicon layer 211 ensures that structure 200 is not affected by a following poly-etching process that is used to remove polysilicon 101 of structure 100 as being discussed below in more details.

Figure 5:
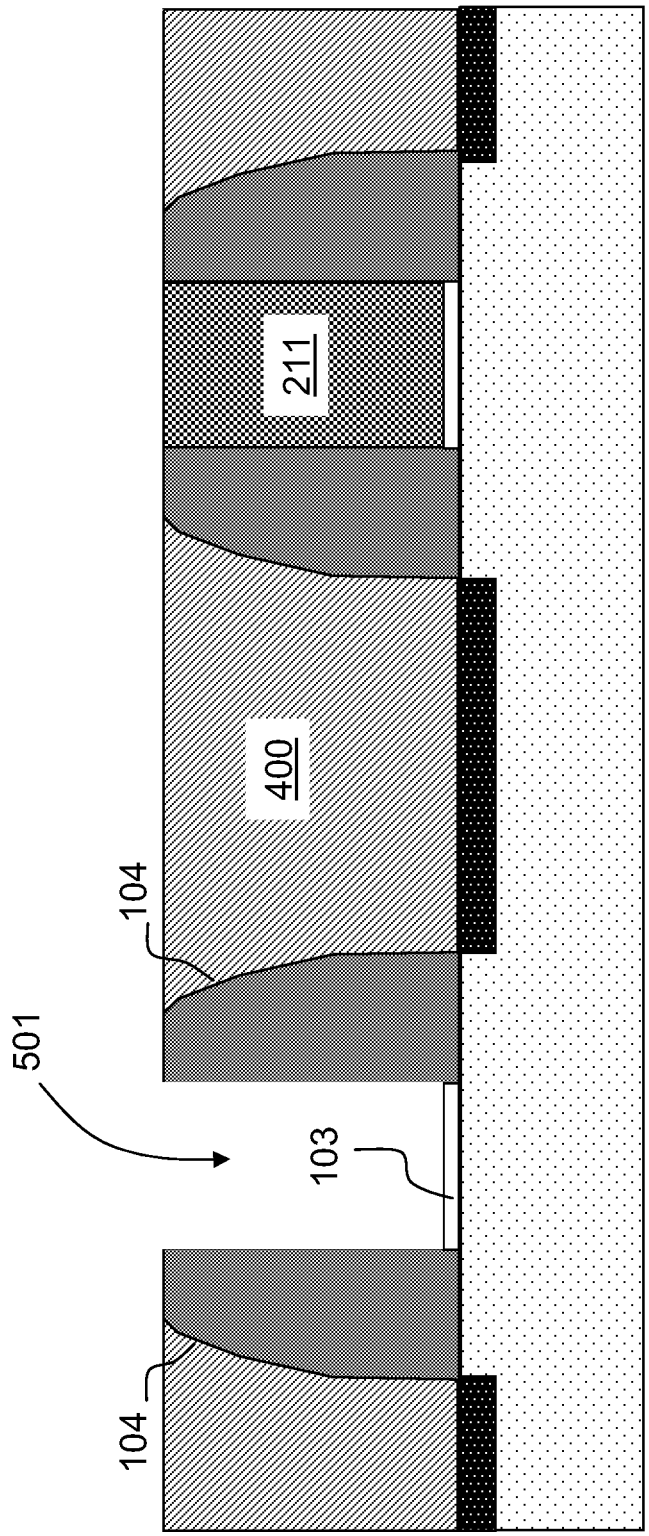
FIG. 5 is a demonstrative illustration of a method of forming e-fuse and transistor on a common substrate, following the steps shown in FIG. 4, according to one embodiment of the present invention.

FIG. 5 is a demonstrative illustration of a method of forming e-fuse in a replacement metal gate process, following the steps shown in FIG. 4, according to one embodiment of the present invention. After polysilicon layer 101 of structure 100 is exposed by CMP process 410, one embodiment of the method includes removing polysilicon layer 101 of gate electrode through, for example, a reactive-ion-etching (RIE) process which is selective to modified polysilicon layer 211, to oxide layer 103, to spacers 104 and 204, and to dielectric layer 400. The RIE etching process removes polysilicon 101 of sacrificial gate, creates an opening 501 in the gate region of structure 100, and exposes underneath gate dielectric 103 and sidewalls of spacers 104. It is to be noted that because of dopant implantation in the "gate" region of structure 200, which is now doped polysilicon layer 211 or at least covered by doped polysilicon layer 211 that is selective to the RIE process, structure 200 remains substantially intact although some insignificant etching may occur at the top of doped polysilicon layer 211, caused by imperfection of dopant implantation. However, such insignificant etching is not expected to affect performance of the e-fuse to be formed later by doped polysilicon layer 211. For example, when boron (B) dopant is used, the RIE etching process may employ $NH_4OH$ etchant which is selective to B-implanted polysilicon. A person skilled in the art may appreciate that other dopant/etchant combination may be used as well.

Figure 6:
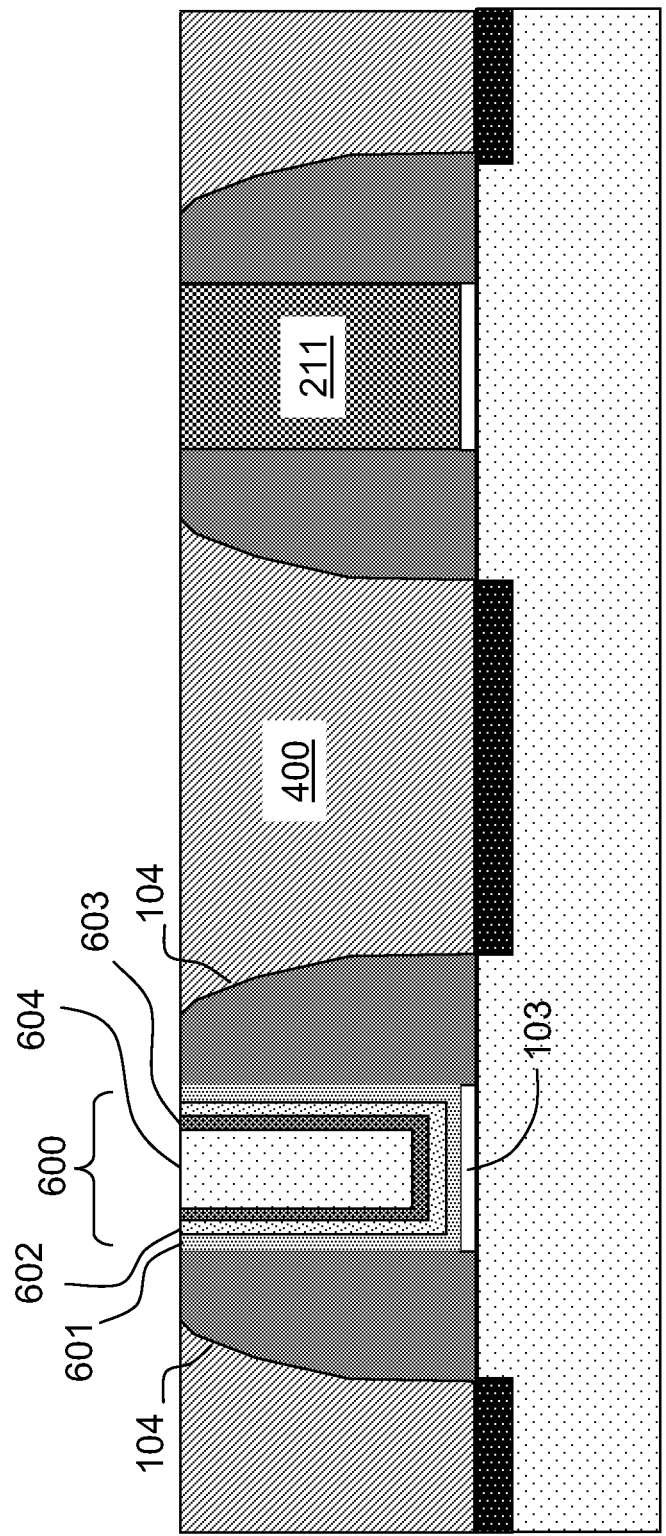
FIG. 6 is a demonstrative illustration of a method of forming e-fuse and transistor on a common substrate, following the steps shown in FIG. 5, according to one embodiment of the present invention.

FIG. 6 is a demonstrative illustration of a method of forming e-fuse in a replacement metal gate process, following the steps shown in FIG. 5, according to one embodiment of the present invention. After polysilicon layer 101 is removed (therefore being a sacrificial gate electrode), a replacement metal gate 600 may be deposited or formed inside opening 501. More specifically, the formation of replacement metal gate 600 may include, for example, first forming a high-k dielectric layer 601 lining opening 501 around sidewalls of spacers 104, then depositing a p-type metal liner 602 on top of dielectric layer 601, subsequently followed by depositing an n-type metal liner 603 on top of the p-type metal liner 602. Here, particulars of the combination of p-type and n-type metals may be used to create a metal gate with proper work function. After that, a bulk aluminum (Al) 604 may fill the rest of opening 501 to finish forming metal gate 600 which collectively includes metal liners 601, 602, 603, and bulk metal 604. After the metal filling of opening 501, the method includes applying a CMP process to remove residual metals left on top of surface 401 during metal deposition/filling process of opening 501 to make top of structure 200 flat.

Figure 7:
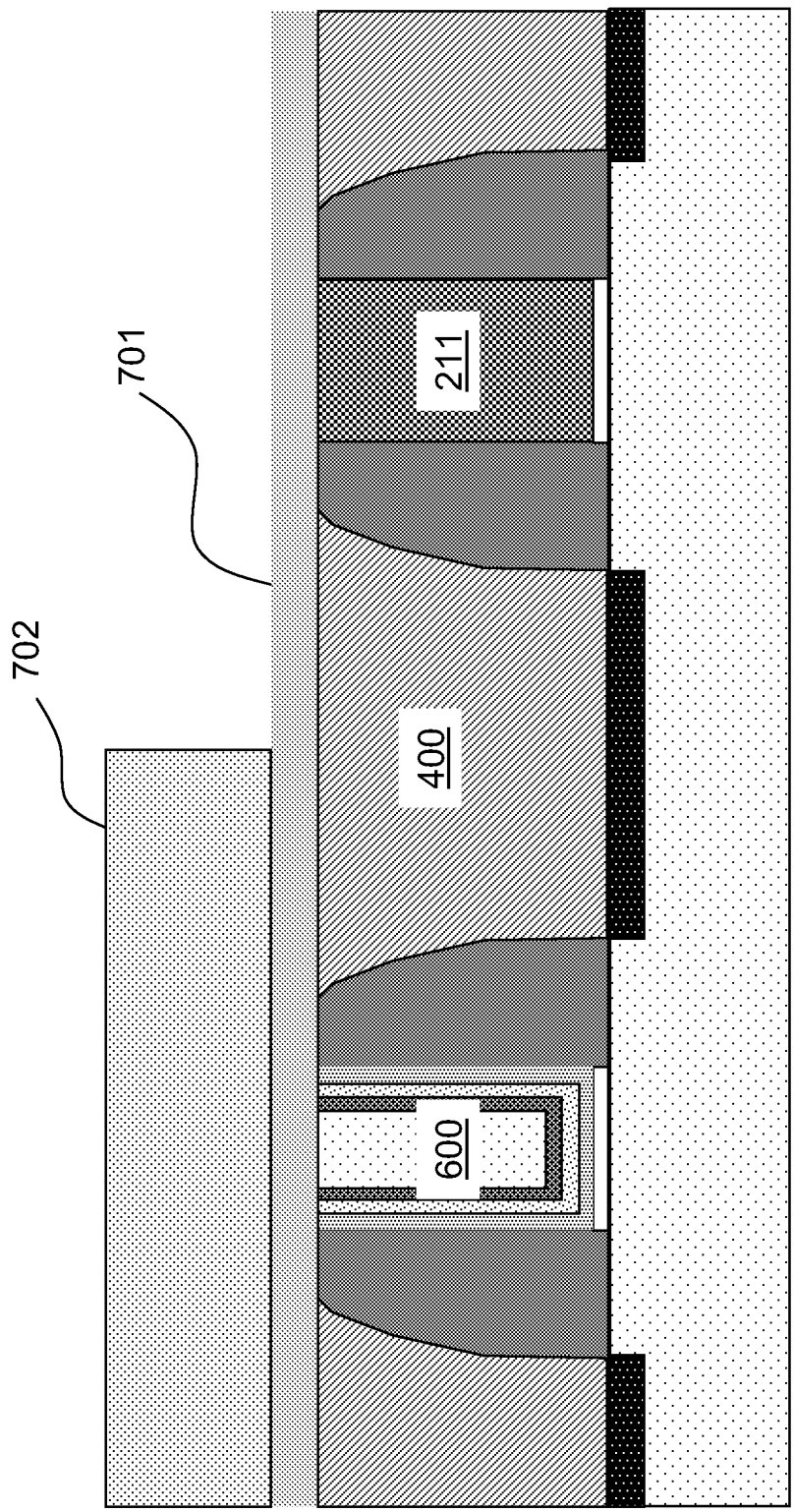
FIG. 7 is a demonstrative illustration of a method of forming e-fuse and transistor on a common substrate, following the steps shown in FIG. 6, according to one embodiment of the present invention.

FIG. 7 is a demonstrative illustration of a method of forming e-fuse in a replacement metal gate process, following the steps shown in FIG. 6, according to one embodiment of the present invention. Following the formation of replacement metal gate 600, one embodiment of the method includes forming a hard mask in order to cover structure 100 in a process of performing silicidation of modified polysilicon layer 211 of structure 200 as a step of forming e-fuse 1200. More specifically, the method includes first depositing a thin layer of hard mask material 701, for example silicon-nitride (SiN) covering the top surface 401 including replacement metal gate 600, modified polysilicon layer 211 and oxide layer 400. A photo-resist layer may then be deposited on top of hard mask layer 701, and patterned through a lithographic process to form a photo-resist pattern 702. Photo-resist pattern 702 may be formed, on top of hard mask layer 701, above structure 100 and expose a portion of hard mask layer 701 that is on top of structure 200.

Figure 8:
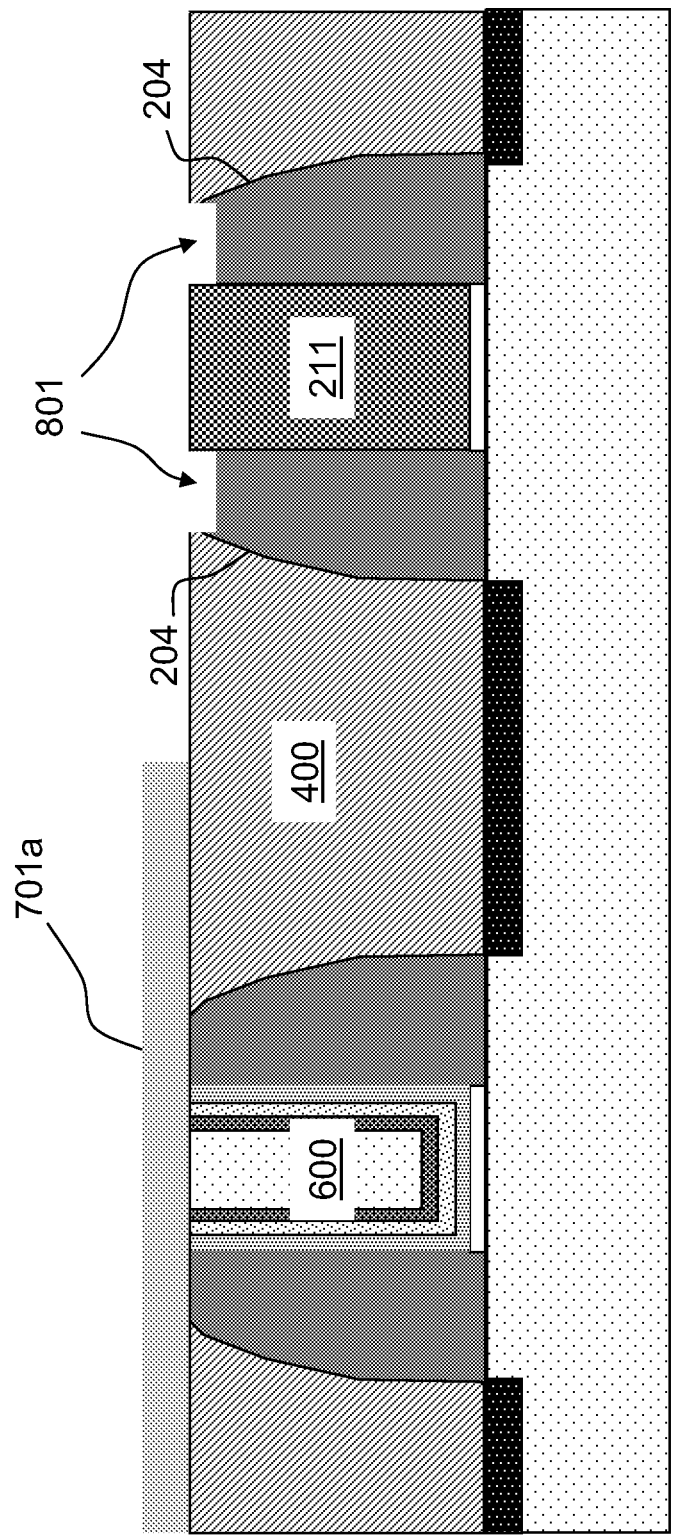
FIG. 8 is a demonstrative illustration of a method of forming e-fuse and transistor on a common substrate, following the steps shown in FIG. 7, according to one embodiment of the present invention.

FIG. 8 is a demonstrative illustration of a method of forming e-fuse in a replacement metal gate process, following the steps shown in FIG. 7, according to one embodiment of the present invention. Following the formation of photo-resist pattern 702, the exposed portion of hard mask layer 701 may be etched away with photo-resist pattern 702 protecting the rest of hard mask layer 701, thereby forming a hard mask pattern 701a that covers only structure 100. The etching of hard mask layer 701 exposes modified polysilicon layer 211. To make sure modified polysilicon layer 211 is fully exposed in order to ensure quality of a subsequent silicidation process, some over-etch of modified polysilicon layer 211, as well as over-etch 801 in surrounding spacers 204, may be performed. Following the formation of hard mask pattern 701a, photoresist pattern 702 may be lifted or stripped off.

Figure 9:
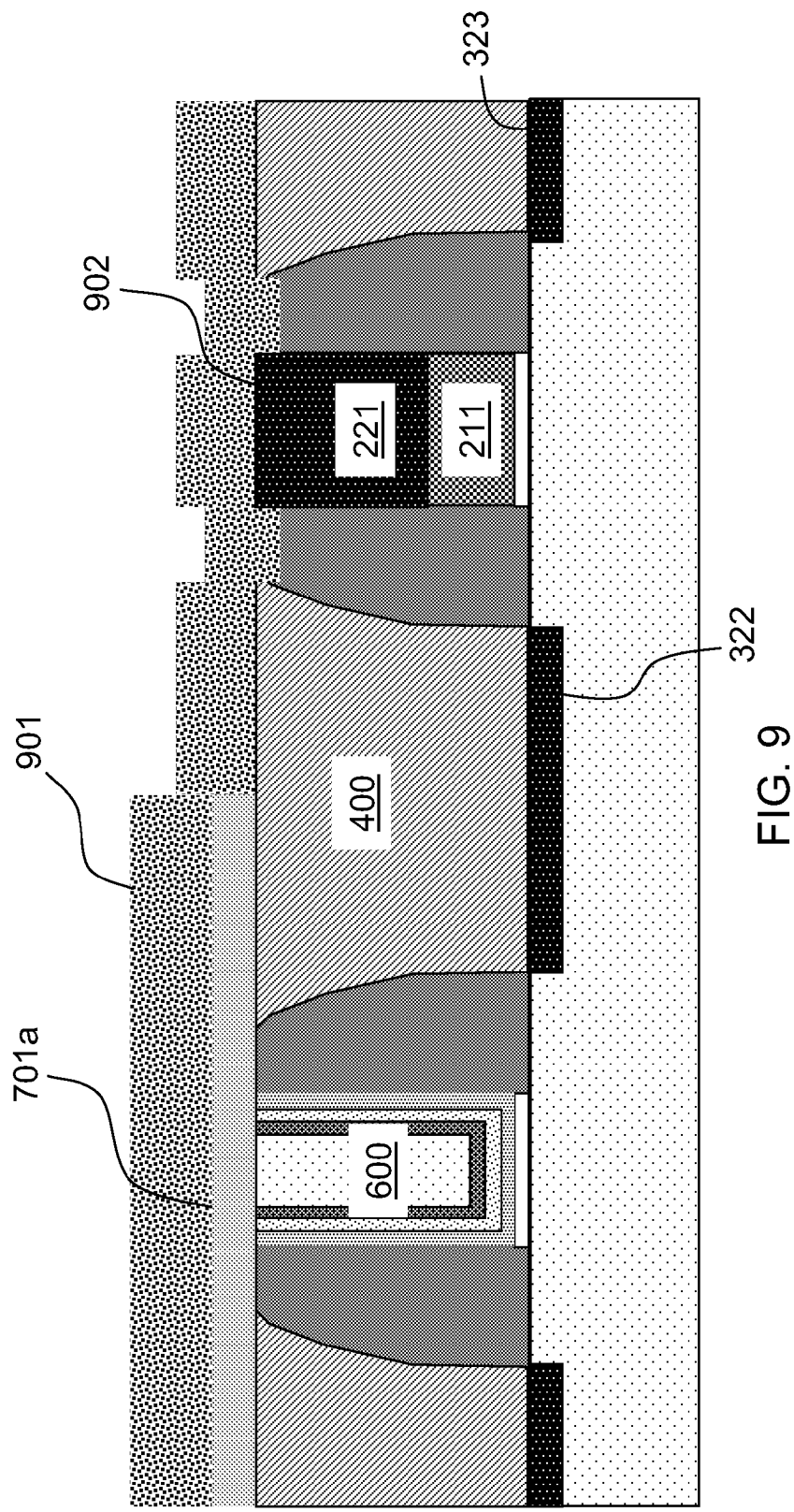
FIG. 9 is a demonstrative illustration of a method of forming e-fuse and transistor on a common substrate, following the steps shown in FIG. 8, according to one embodiment of the present invention.

FIG. 9 is a demonstrative illustration of a method of forming e-fuse in a replacement metal gate process, following the steps shown in FIG. 8, according to one embodiment of the present invention. Following the formation of hard mask 701a, a suitable metal layer 901 such as, for example, nickel (Ni) may be formed through, for example, deposition on top of exposed doped polysilicon layer 211. With replacement metal gate 600 being covered by hard mask 701a therefore not in contacting with metal layer 901, embodiment of the present invention may include performing a rapid thermal annealing (RTA) process to cause the metal diffuse into underneath doped polysilicon layer 211, thereby turning at least the upper portion of doped polysilicon layer 211 into a silicide layer 902. For example, when nickel is used as metal layer 901, silicide layer 902 may be a nickel-silicide which becomes conductor 221 of e-fuse 1200 as illustrated in FIG. 10. During the RTA process, spacers 204 next to e-fuse conductor 221 prevents substrate 1000 from being silicided which as a result keeps e-fuse conductor 221 being insulated from silicide 322 and 323.

FIG. 10 is a demonstrative illustration of a method of forming e-fuse in a replacement metal gate process, following the steps shown in FIG. 9, according to one embodiment of the present invention. Following the formation of e-fuse conductor 221 through the RTA process, un-reacted metal that remains on top of e-fuse conductor 221 may be removed or stripped off through processes that are known in the art or by any future developed processes. Subsequently, a dielectric layer 1001 such as, for example, silicon-nitride (SiN) layer may be deposited to cover both transistor 1100 and e-fuse 1200 as a preparation step for further device processing. In one embodiment, the top surface of insulating layer 1001 may be subsequently planarized through for example a CMP process such that transistor 1100 and e-fuse 1200 may have a coplanar surface 1002, on top of which middle-of-line (MOL) vias and/or interconnects may be formed. For example, a hafnium-oxide layer may be deposited as a barrier layer between the MOL layer and underneath active and/or FEOL (front-end-of-line) devices such as transistors and e-fuses.

While the invention has been described in terms of exemplary embodiments, those skilled in the art will recognize that the invention can be practiced with modifications and in the spirit and scope of the appended claims.

What is claimed is:

1. A method of forming an electronic fuse comprising:
    forming a polysilicon structure on top of a semiconductor substrate;
    implanting at least one dopant into said polysilicon structure to create a doped polysilicon layer in at least a top portion of said polysilicon structure;
    subjecting said doped polysilicon layer to a reactive-ion-etching (RIE) process, said doped polysilicon layer being substantially unaffected by said RIE process; and
    converting said polysilicon structure including said doped polysilicon layer into a silicide to form said electronic fuse,
    wherein subjecting said doped polysilicon layer to said RIE process further comprises removing a cap layer on top of a sacrificial gate electrode of a transistor, wherein said transistor is formed on said semiconductor substrate thereupon said polysilicon structure is formed and wherein said removing removes, at most, a fraction of said doped polysilicon layer with rest of said doped polysilicon layer covering rest of said polysilicon structure, and subsequently applying said RIE process in removing selectively said sacrificial gate electrode of said transistor.

2. The method of claim 1, wherein said at least one dopant is boron (B).

3. The method of claim 2, further comprising, before performing said RIE process, performing a rapid thermal annealing (RTA) process to activate said boron dopant being implanted.

4. The method of claim 1, wherein said polysilicon structure is insulated from said semiconductor substrate by a dielectric layer formed directly underneath said polysilicon structure, and has dielectric spacers formed at sidewalls thereof.

5. The method of claim 1, wherein converting said polysilicon structure into said silicide further comprises:
    forming a hard mask pattern, said hard mask pattern covering said transistor but exposing said doped polysilicon layer and said polysilicon structure underneath;
    depositing a metal layer in direct contact with said doped polysilicon layer; and
    causing diffusion, through a rapid thermal annealing process, of said metal layer into at least said doped polysilicon layer to create said silicide.

6. The method of claim 5, wherein said metal layer is a layer of nickel, further comprising causing diffusion of said nickel into said polysilicon structure underneath said doped polysilicon layer.

7. The method of claim 1, wherein said doped polysilicon layer is not etched by said RIE process.

8. The method of claim 1, wherein said implanting converts entire said polysilicon structure into said doped polysilicon layer.

9. A method comprising:
    forming a polysilicon structure and a field-effect-transistor (FET) structure together on top of a common semiconductor substrate, said FET structure having a sacrificial gate electrode;
    implanting at least one dopant into said polysilicon structure to create a doped polysilicon layer in at least a top portion of said polysilicon structure;
    subjecting said polysilicon structure and said FET structure to a reactive-ion-etching (RIE) process, said RIE process selectively removing said sacrificial gate electrode of said FET structure while said doped polysilicon layer being substantially unaffected by said RIE process; and
    converting said polysilicon structure including said doped polysilicon layer into a silicide to form said electronic fuse,
    wherein converting said polysilicon structure into said silicide further comprises:
    forming a hard mask pattern, said hard mask pattern covering said FET structure but exposing said doped polysilicon layer and said polysilicon structure underneath;
    depositing a metal layer in direct contact with said doped polysilicon layer; and
    causing diffusion, through a rapid thermal annealing process, of said metal layer into at least said doped polysilicon layer to create said silicide.

10. The method of claim 9, wherein said at least one dopant is boron (B), said boron being implanted into said polysilicon structure while said FET structure is protected from said boron implantation, by a photo-resist mask.

11. The method of claim 10, further comprising, after said boron implantation, performing a rapid thermal annealing (RTA) process to activate said boron dopant such that said doped polysilicon layer being resistant to said RIE process.

12. The method of claim 9, further comprising, before performing said RIE process, removing a cap layer on top of said sacrificial gate electrode of said FET structure, wherein said removing also removes, at most, a fraction of said doped polysilicon layer with rest of said doped polysilicon layer covering rest of said polysilicon structure.

13. The method of claim 9, wherein said metal layer is a layer of nickel, further comprising causing said nickel diffuse into said polysilicon structure underneath said doped polysilicon layer.

14. A method comprising:
 forming an electronic fuse (e-fuse) structure and a field-effect-transistor (FET) structure on top of a semiconductor substrate, said e-fuse structure including a polysilicon layer and said FET structure having a sacrificial gate electrode;
 implanting a boron (B) dopant into said polysilicon layer of said e-fuse structure to create a doped polysilicon layer in at least a top portion thereof;
 removing a cap layer on top of said sacrificial gate electrode of said FET structure, wherein said removing also removes a fraction of said doped polysilicon layer with rest of said doped polysilicon layer covering rest of said e-fuse structure;
 subjecting said e-fuse structure and said FET structure to a common reactive-ion-etching (RIE) process, said RIE process selectively removing said sacrificial gate electrode of said FET structure while causing no substantial changes to said e-fuse structure; and
 performing silicidation of said doped polysilicon layer to convert said e-fuse structure into an e-fuse.

15. The method of claim 14, wherein said implanting converts said e-fuse structure entirely into said doped polysilicon layer.

16. The method of claim 14, wherein during said implanting, said FET structure is covered by a photo-resist mask, said photo-resist mask preventing said FET structure from being implanted by said boron dopant.

* * * * *